US006097102A

United States Patent [19]
Takizawa

[11] Patent Number: 6,097,102
[45] Date of Patent: Aug. 1, 2000

[54] RETICLE, SEMICONDUCTOR WAFER, AND SEMICONDUCTOR CHIP

[75] Inventor: Atsushi Takizawa, Kawasaki, Japan

[73] Assignee: Fujitsu Limited, Kawasaki, Japan

[21] Appl. No.: 09/315,842

[22] Filed: May 21, 1999

Related U.S. Application Data

[62] Division of application No. 08/874,713, Jun. 13, 1997, Pat. No. 5,929,529.

[30] Foreign Application Priority Data

Dec. 18, 1996 [JP] Japan ...................................... 8-338702

[51] Int. Cl.$^7$ .................................................. H01L 23/544
[52] U.S. Cl. ............................................ 257/797; 257/620
[58] Field of Search ................................... 257/797, 620; 356/401

[56] References Cited

U.S. PATENT DOCUMENTS

| | | | |
|---|---|---|---|
| 4,134,066 | 1/1979 | Vogel et al. ............................. | 257/797 |
| 4,566,795 | 1/1986 | Matsuura et al. ....................... | 356/401 |
| 4,677,301 | 6/1987 | Tanimoto et al. ...................... | 250/548 |
| 4,723,221 | 2/1988 | Matsuura et al. ....................... | 356/401 |
| 4,794,648 | 12/1988 | Ayata et al. ............................ | 356/401 |
| 4,981,529 | 1/1991 | Tsujita ..................................... | 257/797 |
| 5,003,374 | 3/1991 | Vokoun, III ............................. | 257/797 |
| 5,051,807 | 9/1991 | Morozumi ................................ | 257/369 |
| 5,376,589 | 12/1994 | Thienel ................................... | 257/797 |
| 5,665,645 | 9/1997 | Kinugawa ............................... | 438/637 |
| 5,684,333 | 11/1997 | Moriyama ............................... | 257/797 |
| 5,702,567 | 12/1997 | Mitsui et al. ......................... | 156/644.1 |
| 5,721,619 | 2/1998 | Hiruma et al. .......................... | 356/401 |
| 5,777,392 | 1/1979 | Fujii ....................................... | 257/797 |

FOREIGN PATENT DOCUMENTS

410060787 2/1998 Japan .

*Primary Examiner*—David Hardy
*Assistant Examiner*—Jhihan B Clark
*Attorney, Agent, or Firm*—Armstrong, Westerman, Hattori, McLeland & Naughton

[57] ABSTRACT

A reticle has a transfer region and a peripheral region defined in the plane of the reticle, the transfer region being formed with a pattern to be transferred and the peripheral region being disposed surrounding the periphery of the transfer region. Reference marks for defining one virtual reference line is formed in the plane of the reticle. A transfer pattern is formed in the transfer region and includes a long linear line segment oblique to the reference line. A pair of direction designating marks is disposed in the peripheral region along a virtual straight line parallel or perpendicular to the linear line segment of the transfer pattern.

5 Claims, 9 Drawing Sheets

RETICLE, SEMICONDUCTOR WAFER, AND SEMICONDUCTOR CHIP

This application is a division of prior application Ser. No. 08/874,713 filed Jun. 13, 1997. Now U.S. Pat. No. 5,929,529.

This application is based upon Japanese Patent Application HEI 8-338702, filed on Dec. 18, 1996, the entire contents of which are incorporated herein by reference.

BACKGROUND OF THE INVENTION a) Field of the Invention

The present invention relates to reticles, semiconductor wafers, and semiconductor chips, and more particularly to reticles, semiconductor wafers and chips suitable for measuring the widths of circuit patterns.

b) Description of the Related Art

Recent design rules for highly integrated circuit devices use circuit patterns having a width of submicron order. In order to reliably manufacture integrated circuit devices having patterns of submicron order, it is essential to make precise measurements of pattern widths. Each pattern width is measured, for example, after a reticle is formed, or during the manufacture processes of integrated circuit devices, the widths of resist patterns and circuit patterns formed at photolithography and etching processes are also measured before proceeding the next manufacture process.

Figure 7:
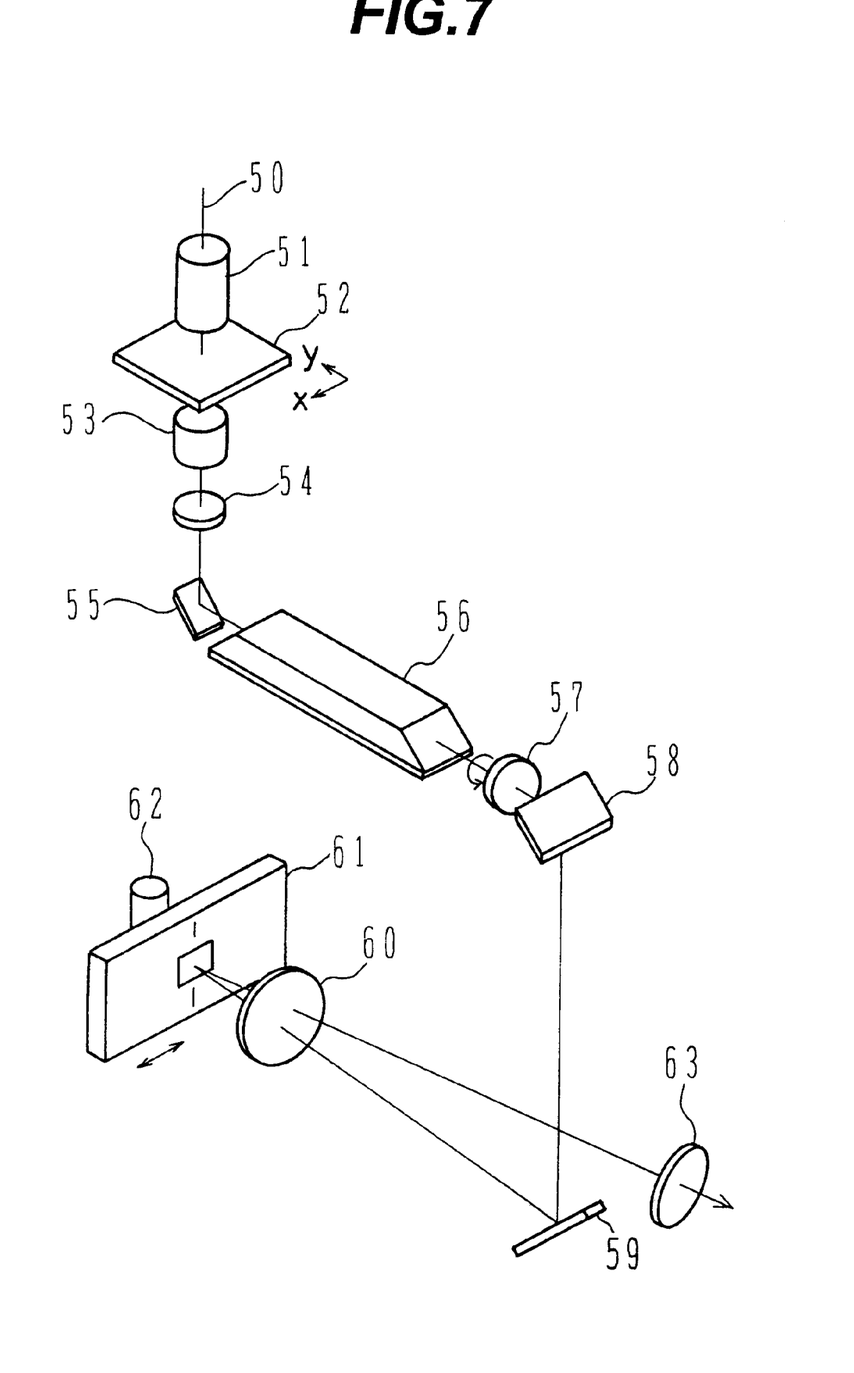
FIG. 7 is a diagram briefly showing the structure of a line width measuring apparatus used by the embodiments of the invention.

FIG. 7 is a schematic diagram showing the structure of a reticle line width measuring apparatus. Illumination light 50 passes through a condenser lens 51 and illuminates a reticle placed on a reticle stage 52. A pattern formed on the reticle is enlarged by an optical system composed of an objective lens 53, a relay lens 54, a mirror 55, an image rotator 56, a relay lens 57, mirrors 58 and 59, and a relay lens 60, and is focussed onto a slit mirror 61. The magnification factor of this optical system is, for example, about 80.

The reticle stage 52 can move the reticle in a plane (x-y plane) parallel to the reticle surface. By moving the reticle in the x-y plane, a desired pattern formed on the reticle can be focussed on a slit mirror 61. An image formed on the slit mirror 61 can be observed through another optical system 63.

The slit mirror 61 is formed with one slit extending in the vertical direction. Light passed through this slit is converted into an electrical signal by a photomultiplier 62. While the slit mirror 61 and photomultiplier 62 are scanned in the horizontal direction along the focus plane, electrical signals having an intensity corresponding to dark/blight areas of an enlarged image of the reticle pattern are obtained.

If the enlarged image of a straight line pattern and the slit are parallel, the pattern width can be calculated from the obtained electrical signals. If the enlarged image of a straight line pattern and the slit are not parallel, the image rotator 56 is rotated about its rotary axis to rotate the enlarged image and align the pattern image and slit in parallel.

A pattern parallel to or perpendicular to a reference line of a reticle used for stepper position alignment easily forms an image parallel to the slit of the slit mirror shown in FIG. 7. However, in order to measure the width of a line oblique to the reference line, it is necessary to rotate the image rotator 56 to make the enlarged image of the line in parallel to the slit.

The image rotator 56 is rotated while an operator views the enlarged pattern image through the optical system 63. If the relationship between the enlarged pattern image and the slit is shifted from parallelism, it is not possible to measure a correct line width. The measured width of an oblique pattern may change with each operator depending upon the measurement skill and the like. Even if the same operator measures, the measured results may change at each measurement.

SUMMARY OF THE INVENTION

It is an object of the present invention to provide a reticle, a semiconductor wafer, and a semiconductor chip capable of reducing a measurement error of the line width of an oblique pattern formed on each of the reticle and semiconductor wafer and pattern.

According to one aspect of the present invention, there is provided a reticle with a transfer region and a peripheral region defined in the plane of the reticle, the transfer region being formed with a pattern to be transferred and the peripheral region being disposed surrounding the periphery of the transfer region, the reticle comprising: reference marks for defining one virtual reference line in the plane of the reticle; a transfer pattern formed in the transfer region and including a long linear line segment oblique to the reference line; and a pair of direction designating marks disposed in the peripheral region along a virtual straight line parallel or perpendicular to the linear line segment of the transfer pattern.

By observing the direction designating marks disposed along the virtual straight line, the direction of a transfer pattern in the longitudinal direction thereof can be detected at high precision. Since the direction of the transfer pattern can be detected at high precision, the measurement precision of a line width can be improved.

According to another aspect of the present invention, there is provided a semiconductor wafer having unit chip regions disposed in a matrix form each having an electronic circuit pattern, a scribe region being retained between adjacent unit chip regions, the semiconductor wafer comprising: a circuit pattern formed in each unit chip region and having a long linear line segment oblique to the row and column directions of unit chip regions; and a pair of direction designating marks disposed in the scribe region along a virtual straight line parallel or perpendicular to the linear line segment of the circuit pattern.

According to a further aspect of the present invention there is provided a semiconductor chip comprising: an integrated circuit pattern having circuit patterns recursively disposed in a matrix form, each recursive unit including a long linear pattern oblique to the row and column directions of the matrix form; and a pair of direction designating marks disposed outside of the area where the recursive unit is disposed in the matrix form, along a virtual straight line parallel or perpendicular to the linear pattern.

By observing the direction designating marks disposed along the virtual straight line, the direction of a circuit pattern in the longitudinal direction thereof can be detected at high precision. Since the direction of the circuit pattern can be detected at high precision, the measurement precision of a line width can be improved.

DETAILED DESCRIPTION OF THE PREFERRED EMBODIMENTS

Figure 1A:
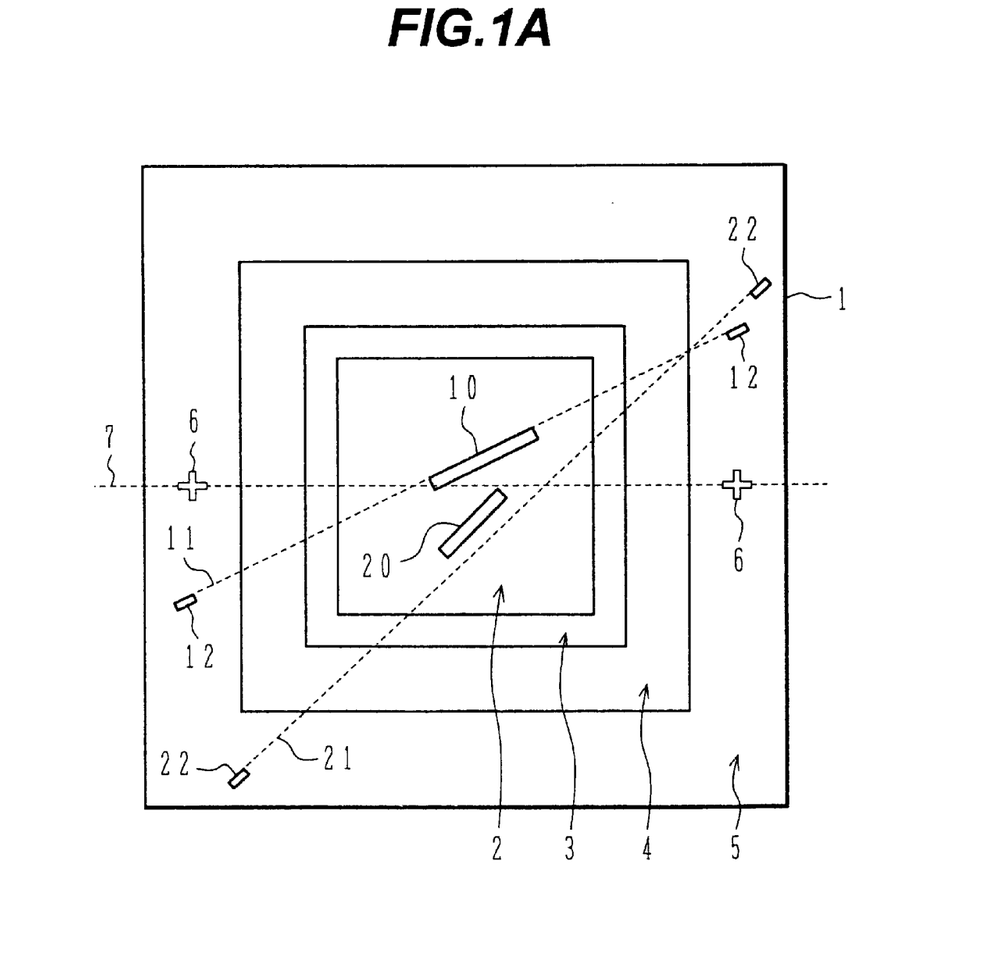
FIGS. 1A to 1C are schematic plan views illustrating reticles according to an embodiment of the invention.

FIG. 1A is a schematic plan view showing a reticle according to the first embodiment of the invention. In the central area of a reticle of generally a square shape, a device region 2 is defined. This device region 2 is surrounded first by a scribe region 3 and then by a light shielding region 4. In the device region 2, circuit patterns to be transferred to a wafer are formed. The scribe region 3 corresponds to an area of a semiconductor wafer along which the wafer is scribed to divide it into chips, and is formed with transfer patterns such as a vernier pattern.

The light shielding region 4 shields exposure light. Patterns formed in the device region 2 and scribe region 3 surrounded by the light shielding region 4 are transferred to a semiconductor wafer. A transparent light transmission region 5 is defined outside of the light shielding region 4.

The light transmission region 5 is formed with a pair of stepper alignment marks 6 used when the reticle is fixed to a stepper. A virtual straight line interconnecting the pair of stepper alignment marks 6 defines a reference line 7 on the reticle surface. Generally, this reference line 7 is parallel to one of pairs of parallel sides defining the outer periphery of the reticle.

In the device region 2 of the reticle 1, linear circuit patterns 10 and 20 are formed. In the accompanying drawings, these linear circuit patterns are drawn in a scale larger than actual patterns in order to help understand the description easily. The circuit patterns 10 and 20 may be either isolated patterns or parts of a complicated pattern.

Consider a virtual straight line 11 extending along the longitudinal direction of the circuit pattern 10. A pair of direction designating marks 12 is disposed in the light transmission region 5 along the virtual straight line 11, sandwiching the device region 12. Consider another virtual straight line 21 in parallel to the longitudinal direction of the circuit pattern 20. A pair of direction designating marks 22 is disposed in the light transmission region 5 along the virtual straight line 21, sandwiching the device region 12.

Next, a method of measuring the line width of the circuit pattern 10 formed on the reticle 1 shown in FIG. 1A by using a line width measuring apparatus shown in FIG. 7 will be described. The principle of measurement by the line width measuring apparatus shown in FIG. 7 has been described already and it is not duplicated herein.

The reticle 1 shown in FIG. 1A is placed on the reticle stage 52 shown in FIG. 7, being set so that the reference line 7 of the reticle 1 is in parallel to the x-axis. The reticle I is moved in the x-y plane to focus the circuit pattern 10 on the slit mirror 61. In this state, the enlarged image of the circuit pattern 10 is projected obliquely relative to the slit of the slit mirror so that the line width cannot be measured.

In order to allow the line width of the circuit pattern 10 to be measured, it is necessary to set the circuit pattern 10 in parallel to the slit of the slit mirror 61. How the slit and the circuit pattern 10 are made in parallel will be described next.

The line width measuring apparatus shown in FIG. 7 can measure (x, y) coordinates of various patterns formed on a reticle placed on the reticle stage 52. First, (x, y) coordinates of each point of the direction designating mark 12 of the reticle are obtained. From these two (x, y) coordinates, a gradient of the virtual straight line is calculated and then the image rotator 56 is rotated by the angle corresponding to the calculated gradient. In this manner, the circuit pattern 10 and the slit of the slit mirror 61 can be made parallel.

While the virtual straight line 11 and the slit are maintained parallel, the enlarged view of the circuit pattern 10 is projected on the slit mirror 61 at the slit. By scanning the slit mirror 61, electrical signals corresponding the enlarged view of the circuit pattern 10 are obtained. From these electrical signals, the line width of the circuit pattern can be calculated.

Generally, the length of the circuit pattern 10 is very short as compared to the length of the virtual straight line 11 interconnecting the direction designating marks 12, it is therefore difficult to set parallelism between the slit of the slit mirror 10 a nd the enlarged view while observing only the enlarged view of the circuit pattern 10, and in addition, measurement results may contain large errors. In contrast, since the virtual straight line considerably longer than the circuit pattern 10 is used for position alignment, the enlarged view of the circuit pattern and the slit of the slit mirror 61 can be made parallel more precisely.

In the above description, the direction designating marks are disposed on the virtual straight line extending along the circuit pattern 10. These marks are not necessarily disposed on the virtual straight line extending along the circuit pattern, but they may be disposed on a virtual straight line in parallel with the circuit pattern, like the relationship between the circuit pattern 20 and the direction designating marks 22 in which the virtual straight line 21 interconnecting the direction designating marks 22 is set in parallel to the circuit pattern 20. Also in this case, parallelism between the slit of the slit mirror 61 and the enlarged view of the circuit pattern 20 can be obtained at high precision while viewing the virtual straight line 21.

The advantages of the above embodiment will be described next.

In measuring the line width of a linear pattern in parallel to the reference line 7 shown in FIG. 1A, the reference line 7 and the slit of the slit mirror 61 are aligned in parallel to each other. Two persons measured the line width of a pattern having a width of 2 $\mu$m by this method a plurality of times. In this case, the measurement variation was about 13 nm. An oblique pattern having a width of 2 $\mu$m was measured by the same method without using direction designating marks. In this case, the measurement variation was about 30 nm.

By aligning the slit of the slit mirror 61 and the enlarged image in parallel to each other by the embodiment method, the precision in the order similar to a circuit pattern in parallel to the reference line 7 can be expected.

The shape of the direction designating mark shown in FIG. 1A is generally rectangular. Other shapes may be used. If a plurality pair of direction designating marks are formed in correspondence with a plurality of circuit patterns, the shapes of pairs of direction designating marks may be made different in order to discriminate between pairs of different marks. For example, numerals, alphabets, or the like may be used for each of different pairs. Instead of the direction designating marks 12 and 22 shown in FIG. 1A, marks 12a and 22a represented by numerals "1" and "2" are used in an example shown in FIG. 1B and marks 12b and 22b represented by alphabets "A" and "B" are used in an example shown in FIG. 1C. By using different shapes of marks, one pair of marks can be easily discriminated from other pairs of marks.

Figure 1B:
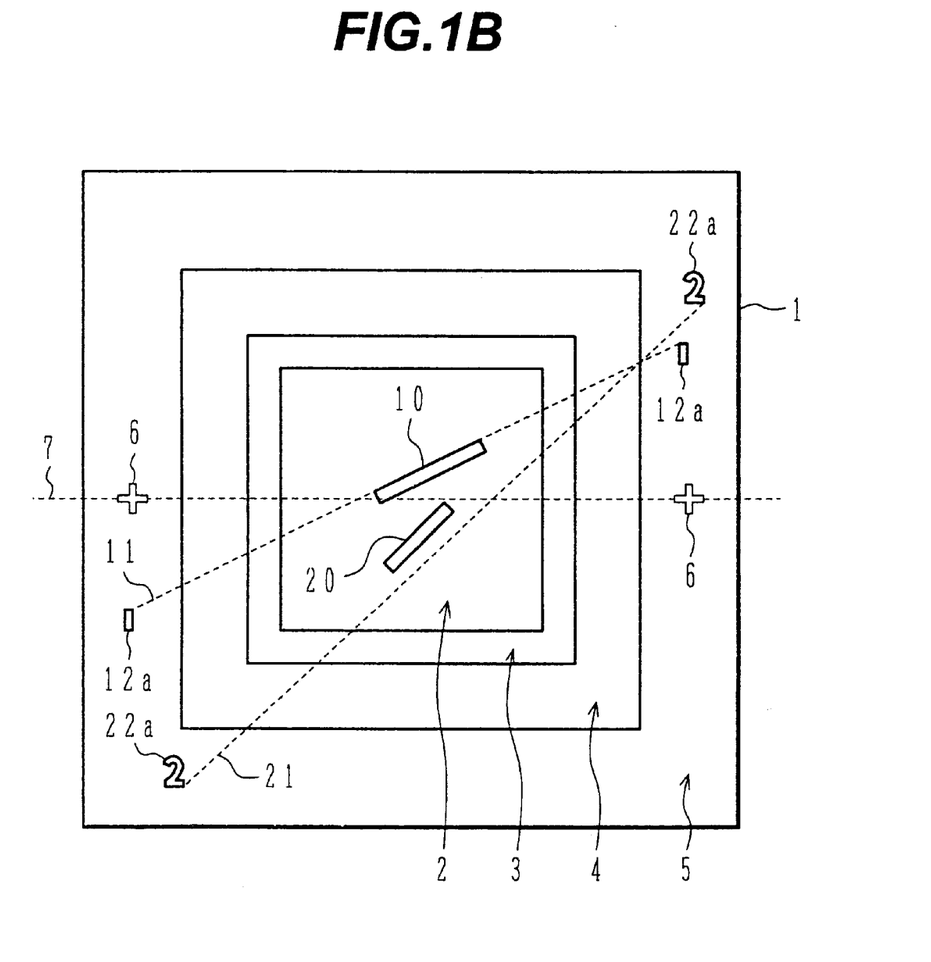
Figure 1C:
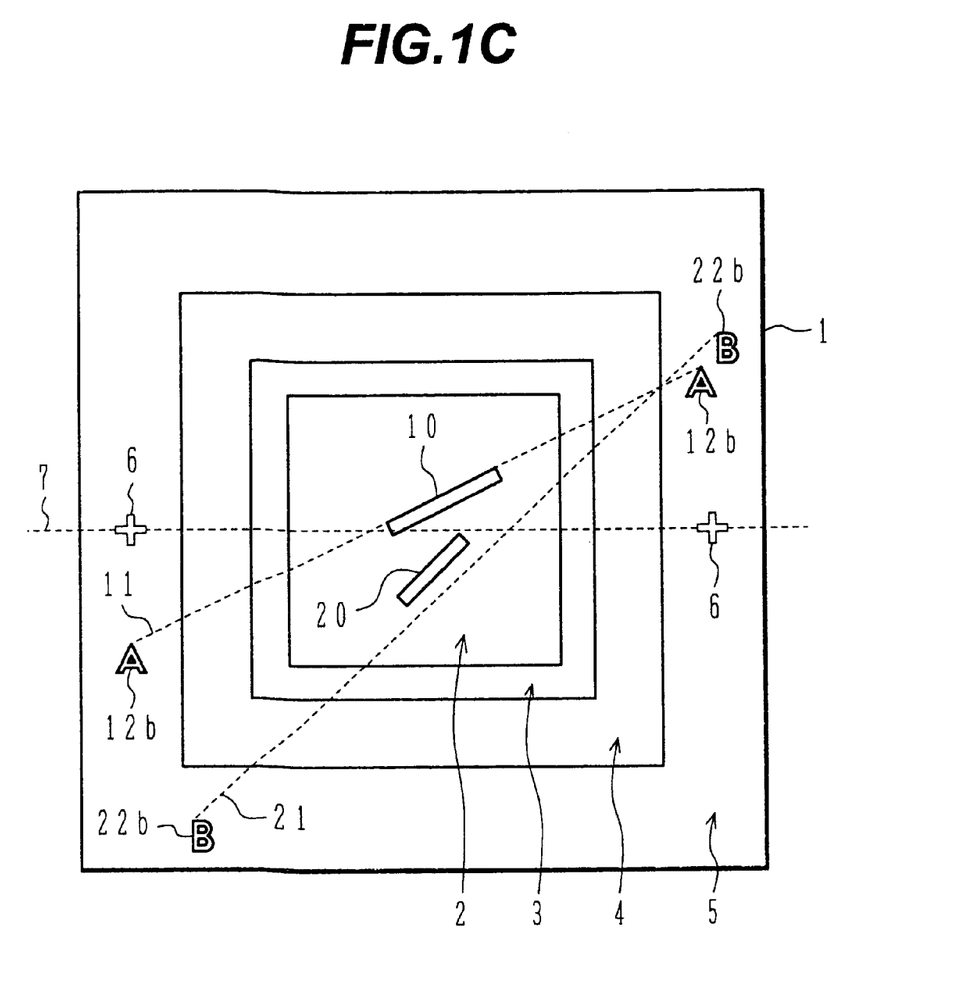

In the embodiment shown in FIGS. 1A to 1C, the virtual straight line interconnecting the direction designating marks is set along the circuit pattern or in parallel to the circuit pattern. The virtual straight line may be set perpendicular to the circuit pattern.

Figure 2:
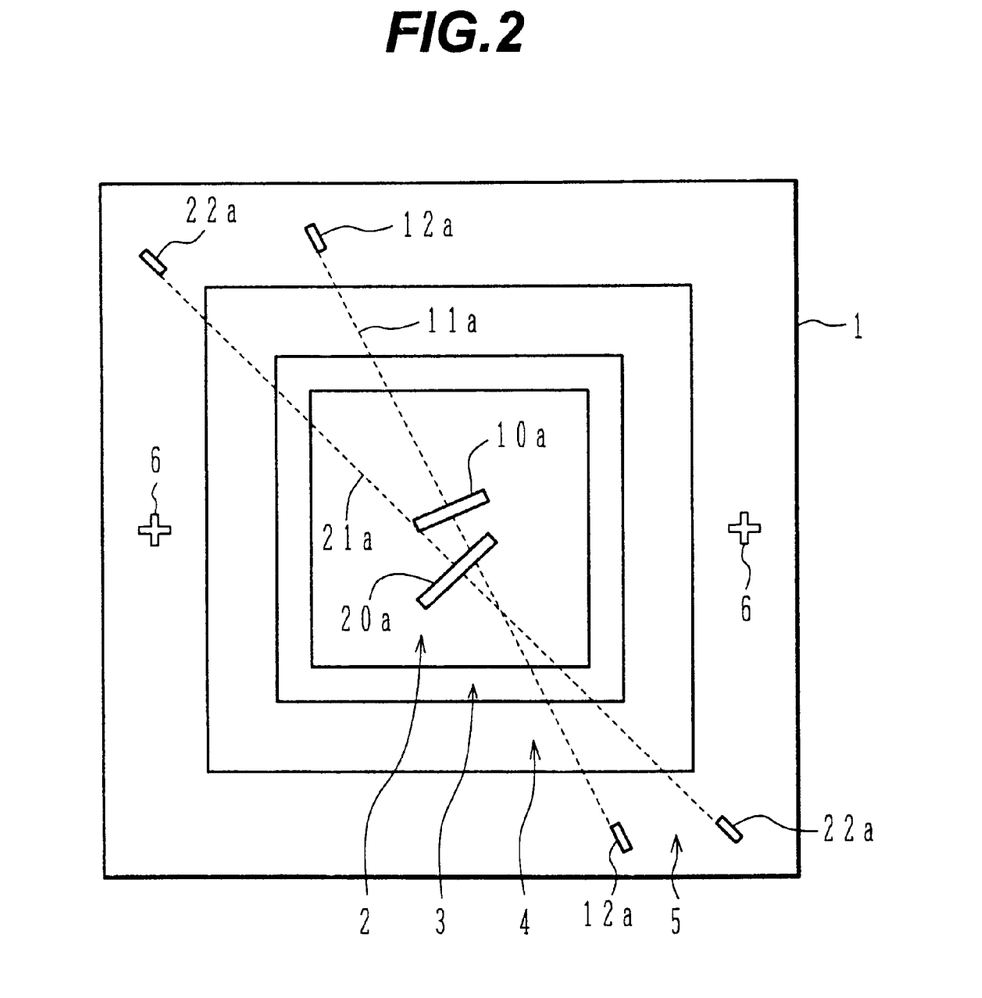
FIG. 2 is a schematic plan view illustrating a reticle according to another embodiment of the invention.

FIG. 2 is a schematic plan view showing a reticle in which a virtual straight line interconnecting direction designating marks is set perpendicular to the circuit pattern. Similar to the case illustrated in FIGS. 1A to 1C, a device region 2, a scribe region 3, a light shielding region 4, and a light transmission region 5 are defined in the reticle 1.

In the device region 2, linear oblique circuit patterns 10a and 20a are formed. A pair of direction designating marks 12a is disposed in the light transmission region 5 along a virtual straight line 11a perpendicular to the circuit pattern 10a, sandwiching the device region 12. Similarly, a pair of direction designating marks 22a is disposed in the light transmission region 5 along a virtual straight line 21a perpendicular to the circuit pattern 20a, sandwiching the device region 12.

In measuring the line width of the circuit pattern 10a, 20a of the reticle shown in FIG. 2, the image rotator 56 shown in FIG. 7 is rotated so that the virtual straight line 11a, 21a is projected on the slit mirror 61 perpendicular to the slit thereof.

Also in this case, since the length of the virtual straight line 11a, 21a is considerably longer than the circuit pattern an 10a, 20a, the line width can be measured at high precision like the cases shown in FIGS. 1A to 1C.

In FIGS. 1A to 1C and FIG. 2, although the direction designating marks are disposed in the light transmission region 5, they may be disposed in the scribe region 3 or in the peripheral area in the device region 2.

Figure 3:
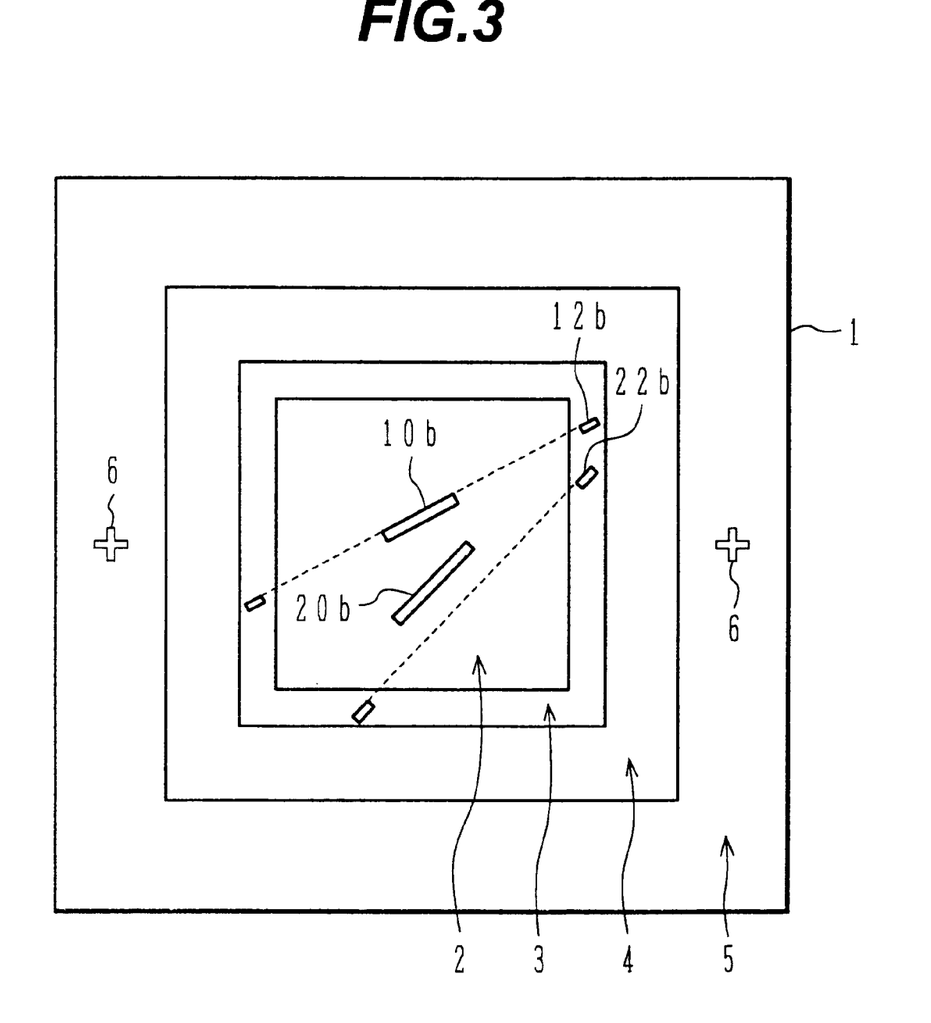
FIG. 3 is a schematic plan view illustrating a reticle according to still another embodiment of the invention.
Figure 4:
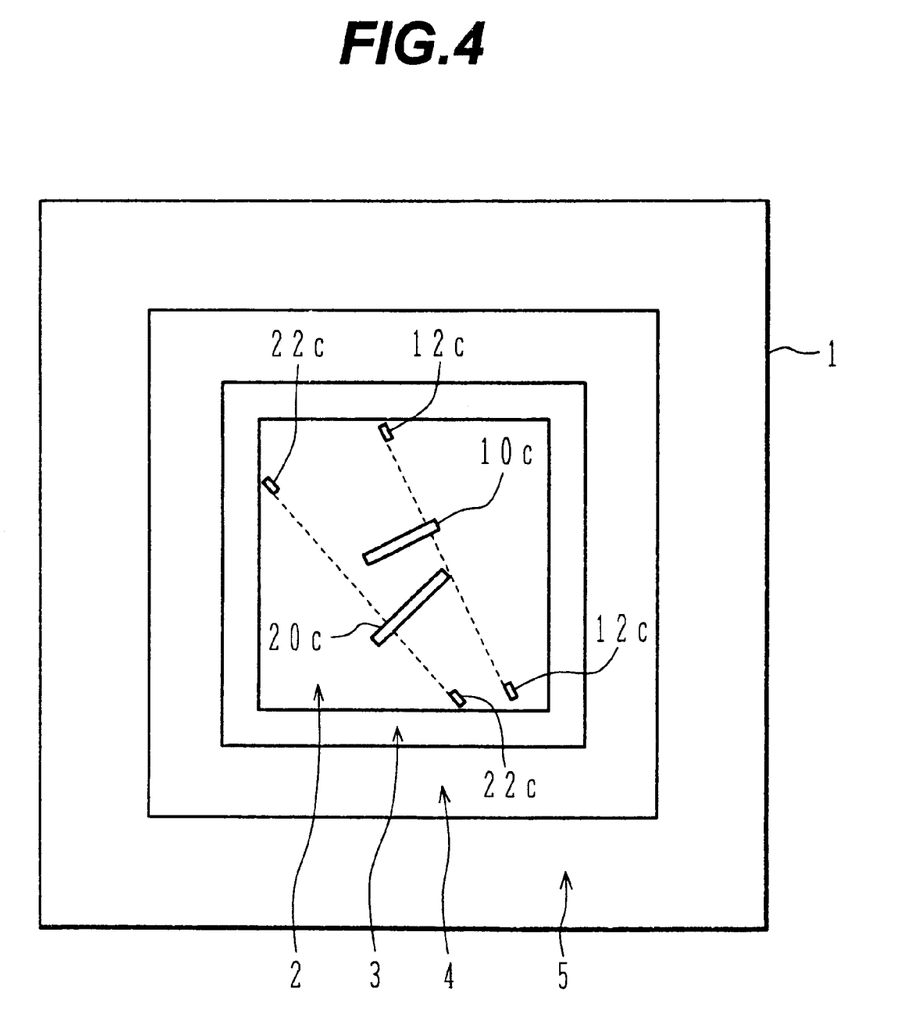
FIG. 4 is a schematic plan view illustrating a reticle according to another embodiment of the invention.

FIG. 3 shows an example of direction designating marks 12b and 22b for respective circuit patterns 10b and 20b disposed in the scribe region 3. FIG. 4 shows an example of direction designating marks 12c and 22c for respective circuit patterns 11c and 20c disposed in the peripheral area in the device region 2. In both the cases, device regions 2, scribe regions 3, light shielding regions 4, and light transmission regions 5 are defined in reticles 1 in the same manner as described with FIG. 1A.

In the example shown in FIG. 3, the virtual straight line interconnecting direction designating marks is set along the circuit pattern or in parallel to the circuit pattern. The virtual straight lines may be set perpendicular to each other. In the example shown in FIG. 4, the virtual straight lines interconnecting direction designating marks are set perpendicular to each other. The virtual straight lines may be set in parallel.

In FIGS. 1A to 1C to FIG. 4, the line width of a circuit pattern formed on a reticle is measured. In the following, measuring the line width of a circuit pattern formed on a semiconductor pattern will be described.

Figure 5A:
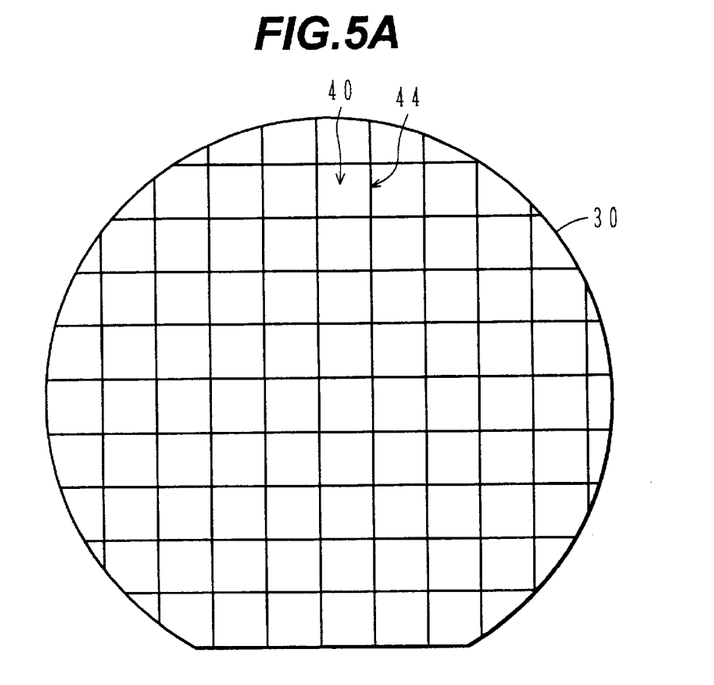
FIG. 5A is a schematic plan view illustrating a semiconductor wafer and FIG. 5B is an enlarged partial view showing the semiconductor wafer, according to another embodiment of the invention.

FIG. 5A is a schematic plan view of a semiconductor wafer. On the surface of the semiconductor wafer 30, chip regions 40 are disposed in a matrix form. Scribe regions 44 are retained between adjacent chip regions 40.

Figure 5B:
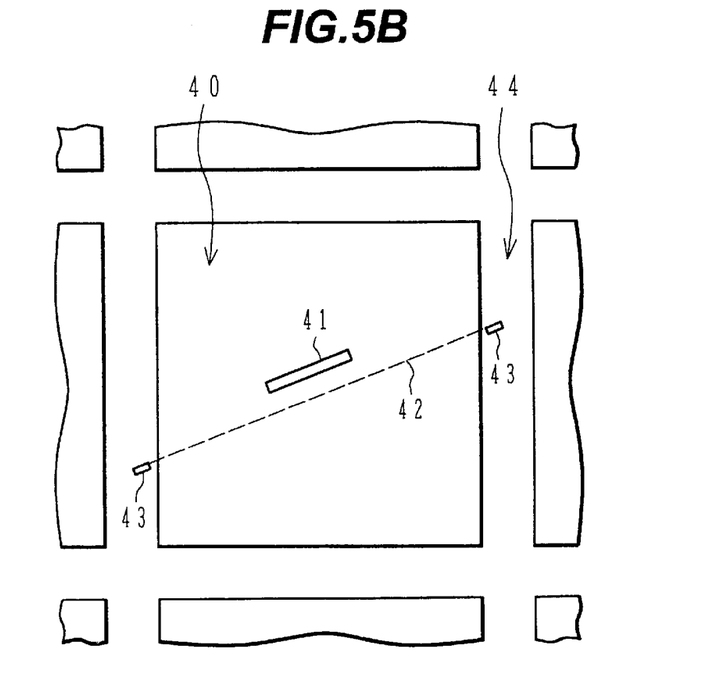

FIG. 5B is a schematic plan view showing one enlarged chip region 40 shown in FIG. 5A. A linear circuit pattern 41 is formed in the chip region 40. The circuit pattern 41 is disposed obliquely relative to the row and column directions of chip regions 40. Consider a virtual straight line 42 parallel to the circuit pattern 41. A pair of direction designating marks 43 is disposed in the scribe region 44 along the virtual straight line 42, sandwiching the chip region 40.

In this case, the transmission type line width measuring apparatus shown in FIG. 7 cannot be used because semiconductor wafers do not transmit visual light. Therefore, in order to measure the line width of a pattern formed on the surface of a semiconductor wafer, for example, a scanning type electron microscope is used. If a scanning type electron microscope is used, instead of rotating the image rotator 56 shown in FIG. 7, a semiconductor wafer itself to be measured is rotated to change the direction of a projected image.

In measuring the line width of the circuit pattern 41 with the scanning type microscope, it is preferable to set the scan direction of an electron beam perpendicular to the circuit pattern. It is easy to finely adjust the angle between the electron beam and circuit pattern while observing the virtual straight line 42. Since the circuit pattern 41 can be made perpendicular to the scan direction of the electron beam at high precision, the precision of measuring a line width can be improved.

Figure 6:
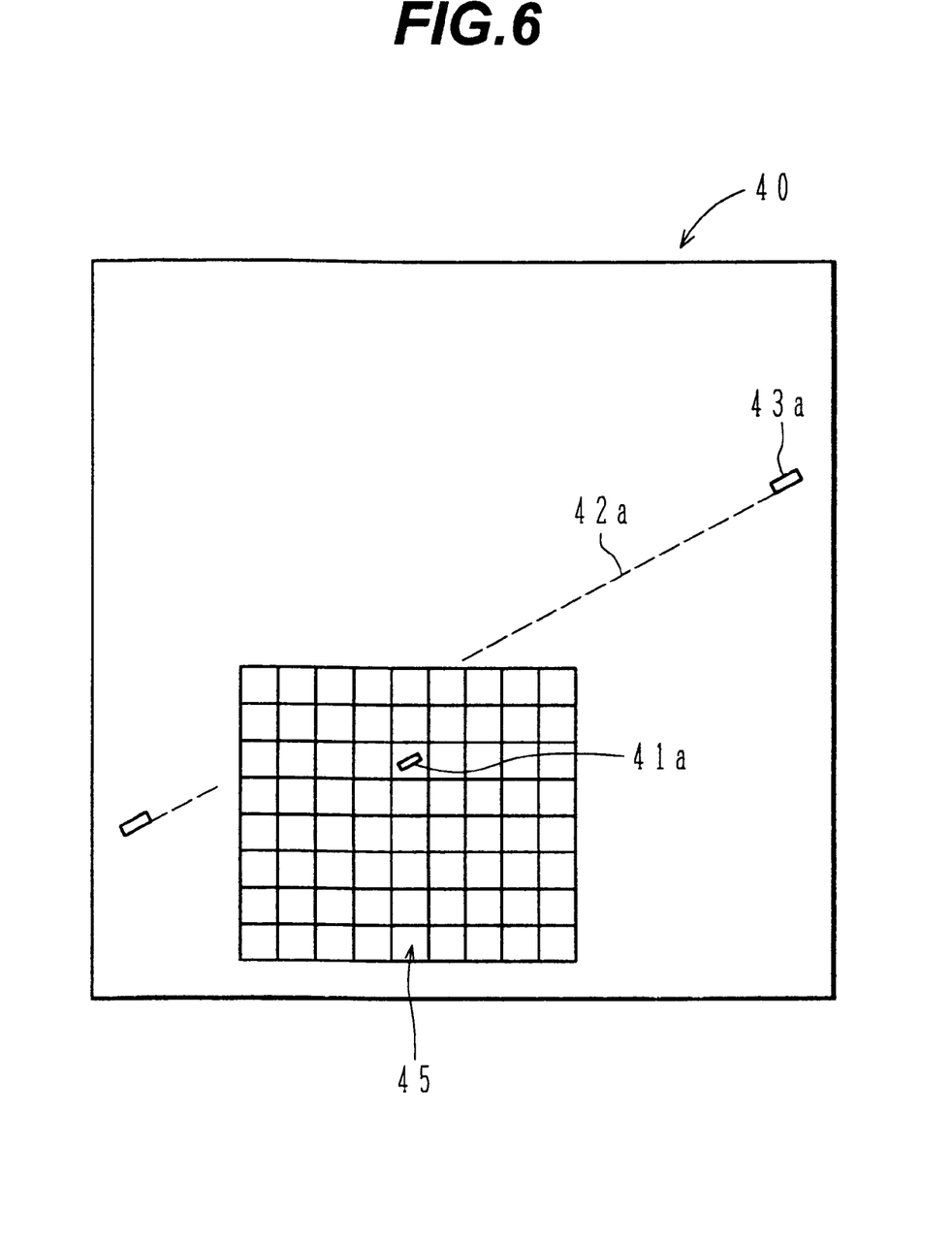
FIG. 6 is a schematic plan view illustrating a semiconductor chip according to another embodiment of the invention.

FIG. 6 shows an example in which direction designating marks are disposed in a chip area. Unit areas 45 each having a circuit pattern are disposed recursively in a matrix shape in the chip region 40.

A linear circuit pattern 41a is formed in each unit area 45 obliquely relative to the row and column directions of unit areas 45. Consider a virtual straight line 42s parallel to the circuit pattern 41a. A pair of direction designating marks 43a is disposed in the peripheral area in the chip region 40 along the virtual straight line 42a. By finely adjusting the angle between the scan direction of an electron beam and the circuit pattern 41a by using the direction designating marks 43a as a guide, the line width of the circuit pattern 41a can be measured at high precision.

In the example shown in FIG. 6, a semiconductor wafer is used. Similar circuit patterns and direction designating marks may be applied to a reticle.

The present invention has been described in connection with the preferred embodiments. The invention is not limited only to the above embodiments. It is apparent that various modifications, improvements, combinations, and the like can be made by those skilled in the art.

What is claimed is:

1. A reticle with a transfer region and a peripheral region defined in the plane of the reticle, the transfer region being formed with a pattern to be transferred and the peripheral region being disposed surrounding the periphery of the transfer region, the reticle comprising:

reference marks for defining one virtual reference line in the plane of the reticle;

a transfer pattern formed in the transfer region and including a long linear line segment oblique to the reference line; and a pair of direction designating marks disposed in the peripheral region along a virtual straight line parallel or perpendicular to the linear line segment of the transfer pattern.

2. A reticle according to claim 1, wherein the peripheral region includes a light shielding region disposed on the inner side of the peripheral region and a light transmission region surrounding the light shielding region, and the direction designating marks are disposed in the light transmission region.

3. A reticle according to claim 1, wherein the transfer region includes a device region formed with an integrated circuit pattern and a scribe region surrounding the device region, the transfer pattern is disposed in the device region, and the direction designating marks are disposed in the scribe region.

4. A reticle according to claim 1, wherein the transfer region includes a device region formed with an integrated circuit pattern and a scribe region surrounding the device region, the transfer pattern is disposed recursively in a matrix form in the device region, and the direction designating marks are disposed in the device region outside of the area where the transfer pattern is recursively disposed.

5. A reticle according to claim 1, wherein a plurality of transfer patterns are formed, a plurality pair of direction designating marks are disposed each pair corresponding to each transfer pattern, and the shape of each pair of marks is determined so as to discriminate between the plurality pair of direction designating marks.

* * * * *